United States Patent
Sharma et al.

(10) Patent No.: US 11,751,404 B2
(45) Date of Patent: Sep. 5, 2023

(54) FINFET TRANSISTOR BASED RESISTIVE RANDOM ACCESS MEMORY

(71) Applicant: Intel Corporation, Santa Clara, CA (US)

(72) Inventors: Abhishek Sharma, Hillsboro, OR (US); Gregory Chen, Portland, OR (US); Phil Knag, Hillsboro, OR (US); Ram Krishnamurthy, Portland, OR (US); Raghavan Kumar, Hillsboro, OR (US); Sasikanth Manipatruni, Portland, OR (US); Amrita Mathuriya, Portland, OR (US); Huseyin Sumbul, Portland, OR (US); Ian A. Young, Portland, OR (US)

(73) Assignee: Intel Corporation, Santa Clara, CA (US)

(*) Notice: Subject to any disclaimer, the term of this patent is extended or adjusted under 35 U.S.C. 154(b) by 1199 days.

(21) Appl. No.: 16/141,025

(22) Filed: Sep. 25, 2018

(65) Prior Publication Data

US 2020/0098826 A1 Mar. 26, 2020

(51) Int. Cl.
| H01L 27/24 | (2006.01) |
| H10B 63/00 | (2023.01) |
| H01L 29/78 | (2006.01) |
| H01L 29/66 | (2006.01) |
| H10N 70/00 | (2023.01) |

(52) U.S. Cl.
CPC ....... *H10B 63/30* (2023.02); *H01L 29/66795* (2013.01); *H01L 29/785* (2013.01); *H10N 70/021* (2023.02); *H10N 70/826* (2023.02); *H10N 70/882* (2023.02); *H10N 70/8833* (2023.02)

(58) Field of Classification Search
CPC ............. H01L 27/2436; H01L 27/2463; H01L 29/66795; H01L 29/785; H01L 45/1233; H01L 45/16
See application file for complete search history.

(56) References Cited

U.S. PATENT DOCUMENTS 10,269,868 B1 * 4/2019 Yang ................... H01L 29/0847

* cited by examiner

*Primary Examiner* — Mark V Prenty
(74) *Attorney, Agent, or Firm* — Schwabe, Williamson & Wyatt, P.C.

(57) ABSTRACT

Embodiments herein describe techniques for a semiconductor device including a RRAM memory cell. The RRAM memory cell includes a FinFET transistor and a RRAM storage cell. The FinFET transistor includes a fin structure on a substrate, where the fin structure includes a channel region, a source region, and a drain region. An epitaxial layer is around the source region or the drain region. A RRAM storage stack is wrapped around a surface of the epitaxial layer. The RRAM storage stack includes a resistive switching material layer in contact and wrapped around the surface of the epitaxial layer, and a contact electrode in contact and wrapped around a surface of the resistive switching material layer. The epitaxial layer, the resistive switching material layer, and the contact electrode form a RRAM storage cell. Other embodiments may be described and/or claimed.

25 Claims, 8 Drawing Sheets

Figure 6 ated to the circuit board and including a plurality of  
FINFET TRANSISTOR BASED RESISTIVE RANDOM ACCESS MEMORY

FIELD

Embodiments of the present disclosure generally relate to the field of integrated circuits, and more particularly, to resistive random access memory (RRAM).

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Resistive random access memory (RRAM) is an emerging technology for next generation non-volatile (NV) random-access memory (RAM). A RRAM memory cell may include a RRAM storage cell coupled to a selector. However, when a Si transistor is used as the selector, a RRAM memory cell may be area inefficient. Moreover, with devices scaling down, the Si transistor used as the selector may leak static power.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Resistive random access memory (RRAM) is an emerging technology for next generation non-volatile (NV) random-access memory (RAM). A RRAM array may include multiple RRAM memory cells. A RRAM memory cell may include a RRAM storage cell coupled to a selector. A RRAM memory cell may store data based on the resistance values of the RRAM storage cell within the RRAM memory cell. A RRAM memory cell may be programmed to a particular resistance value to store a logic value, e.g., "0" or "1". The stored logic value of a RRAM memory cell may be read, for example, by determining current through the selected RRAM memory cell responsive to a voltage applied to the RRAM memory cell.

A RRAM memory cell may have various structures, including different RRAM storage cells coupled to different selectors. For example, a RRAM memory cell may include a 1T1R (one transistor/one resistor) configuration, or a 1D1R (one diode/one resistor) configuration. Under the 1T1R configuration, a RRAM memory cell may include a RRAM storage cell coupled to a transistor as a selector. Compared to a RRAM memory cell in the 1D1R configuration, a RRAM memory cell in the 1T1R configuration may have a better access control during read/write, while having a larger size and not being suitable for stacked structure.

Embodiments herein may present a RRAM memory cell including a FinFET transistor integrated with a RRAM storage cell. The RRAM storage cell is formed as a part of a contact electrode of the FinFET transistor, where the contact electrode may be formed below a first metal layer of a semiconductor device. For example, the RRAM storage cell may be wrapped around a surface of an epitaxial layer, where the epitaxial layer is around a source region or a drain region of a fin structure of the FinFET transistor. As such, the FinFET transistor based on RRAM memory cell may be denser compared to other alternative 1T1R configurations of a RRAM memory cell.

Embodiments herein may present a RRAM memory cell including a FinFET transistor with a RRAM storage cell wrapped around a surface of an epitaxial layer, where the epitaxial layer is around a source region or a drain region of a fin structure of the FinFET transistor. A FinFET transistor includes a fin structure on a substrate, where the fin structure includes a channel region, a source region adjacent to the channel region, and a drain region adjacent to the channel region. An epitaxial layer is around the source region or the drain region. A RRAM storage stack is wrapped around a surface of the epitaxial layer. The RRAM storage stack includes a resistive switching material layer in contact and wrapped around the surface of the epitaxial layer, and a contact electrode in contact and wrapped around a surface of the resistive switching material layer. The epitaxial layer, the resistive switching material layer, and the contact electrode form a RRAM storage cell.

In embodiments, a method for forming a RRAM device may include forming a fin structure on a substrate, where the fin structure includes a channel region, a source region adjacent to the channel region, and a drain region adjacent to the channel region. The method also includes forming an epitaxial layer around the source region or the drain region. In addition, the method includes forming a resistive switching material layer in contact and wrapped around a surface of the epitaxial layer, and forming a contact electrode in contact and wrapped around a surface of the resistive switching material layer. The epitaxial layer, the resistive switching material layer, and the contact electrode form a RRAM storage cell.

Embodiments herein may present a computing device, which may include a circuit board, and a memory device coupled to the circuit board and including a plurality of RRAM memory cells. A RRAM memory cell of the plurality of RRAM memory cells includes a FinFET transistor and a RRAM storage cell. The FinFET transistor includes a fin structure on a substrate, where the fin structure includes a channel region, a source region adjacent to the channel region, and a drain region adjacent to the channel region.

The FinFET transistor also includes an epitaxial layer around the source region or the drain region, and a gate electrode wrapped around the channel region and coupled to a word line of the memory device. The RRAM storage cell includes the epitaxial layer, a resistive switching material layer in contact and wrapped around the surface of the epitaxial layer, and a contact electrode in contact and wrapped around a surface of the resistive switching material layer. The contact electrode is coupled to a source line of the memory device.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, zinc oxide or other combinations of group III-V, II-VI, group IV, or semiconducting oxide materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1:
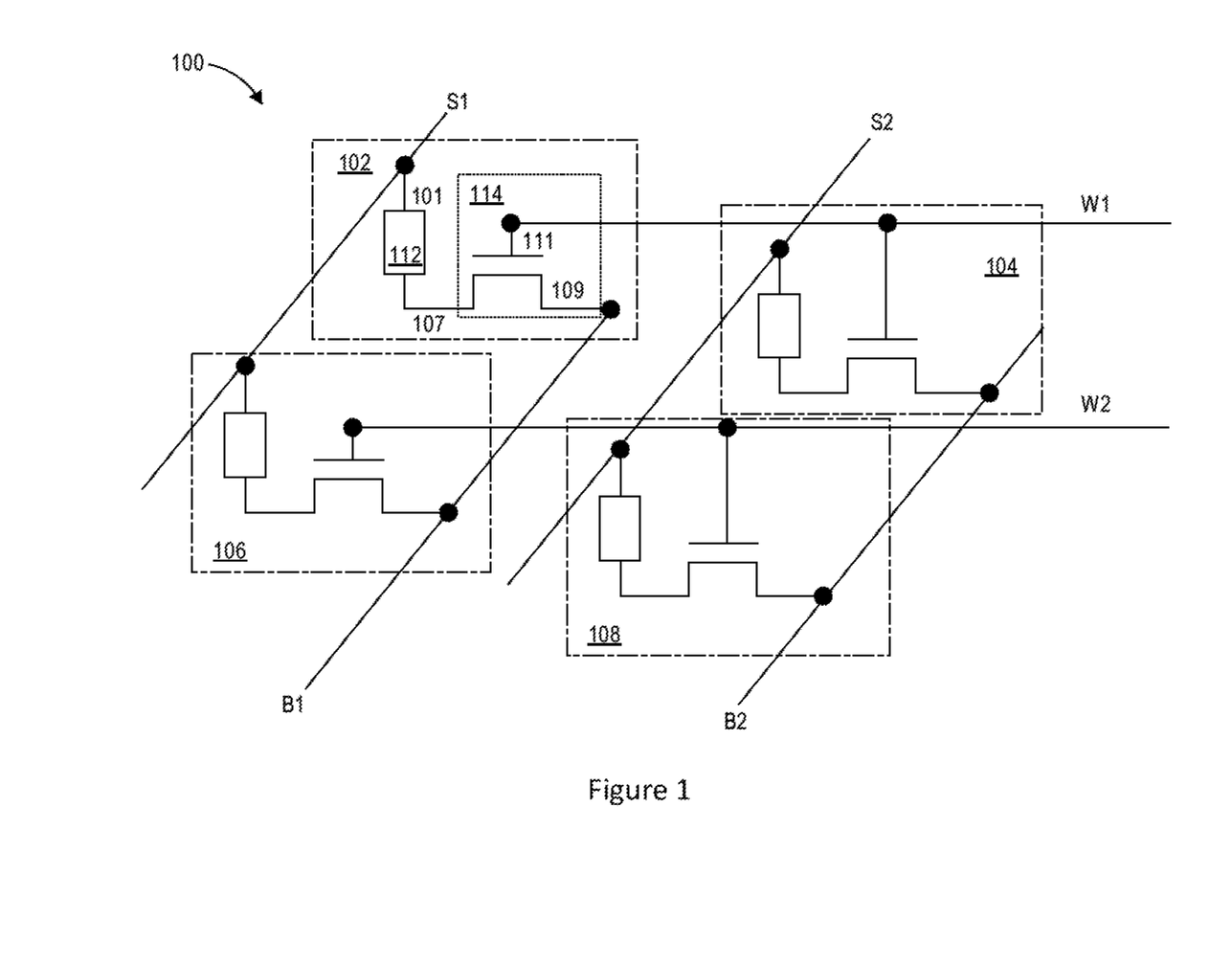
FIG. 1 schematically illustrates an example resistive random access memory (RRAM) array including multiple RRAM memory cells having a FinFET transistor and a RRAM storage cell, in accordance with various embodiments.

FIG. 1 schematically illustrates an example RRAM array 100 including multiple RRAM memory cells, e.g., a memory cell 102, a memory cell 104, a memory cell 106, and a memory cell 108, having a FinFET transistor and a RRAM storage cell, in accordance with various embodiments. For clarity, features of the RRAM array 100, the memory cell 102, the memory cell 104, the memory cell 106, and the memory cell 108 may be described below as examples for understanding an example RRAM array including multiple RRAM memory cells. It is to be understood that there may be more or fewer components within a RRAM array or RRAM memory cells. Further, it is to be understood that one or more of the components within a RRAM array, or RRAM memory cells, may include additional and/or varying features from the description below, and may include any device that one having ordinary skill in the art would consider and/or refer to as a RRAM array or RRAM memory cells.

In embodiments, the multiple memory cells may be arranged in a number of rows and columns coupled by bit lines, e.g., bit line B1 and bit line B2, word lines, e.g., word line W1 and word line W2, and source lines, e.g., source line S1 and source line S2. The memory cell 102 may be coupled in series with the other memory cells, e.g., the memory cell 104, of the same row, and may be coupled in parallel with the memory cells of the other rows, e.g., the memory cell 106, and the memory cell 108. The memory array 100 may include any suitable number of one or more memory cells.

In embodiments, multiple memory cells, such as the memory cell 102, the memory cell 104, the memory cell 106, and the memory cell 508, may have a similar configuration. For example, the memory cell 102 may include a FinFET transistor 114 coupled to a RRAM storage cell 112 in a 1T1R configuration. The memory cell 102 may be controlled through multiple electrical connections to read from the memory cell, write to the memory cell, and/or perform other memory operations.

In embodiments, the FinFET transistor 114 may be a selector for the memory cell 102. A word line W1 of the memory array 100 may be coupled to a gate electrode 111 of the FinFET transistor 114. When the word line W1 is active, the FinFET transistor 114 may select the storage cell 102. A source line S1 of the memory array 100 may be coupled to an electrode 101 of the storage cell 112, while another electrode 107 of the storage cell 112 may be shared with the FinFET transistor 114. In addition, a bit line B1 of the memory array 100 may be coupled to another electrode, e.g., an electrode 109 of the FinFET transistor 114. The shared electrode 107 may be a source electrode or a drain electrode of the FinFET transistor 114, while the electrode 109 may be a drain electrode or a source electrode of the FinFET transistor 114. A drain electrode and a source electrode may be used interchangeably herein. Additionally, a source line and a bit line may be used interchangeably herein. When the word line W1 is active, a signal from the source line S1 may pass through the storage cell 112, further through channel area of the FinFET transistor 114 to reach the other electrode, which is the bit line B1.

In embodiments, the memory cell 102 may be switchable between two or more resistance values upon application of an electric current or voltage. For example, the memory cell 102 may have a first resistance value to store a logic 0, and may have a second resistance value to store a logic 1. In embodiments, the resistance difference between the two resistance values may be one or more orders of magnitude.

Figure 2A:
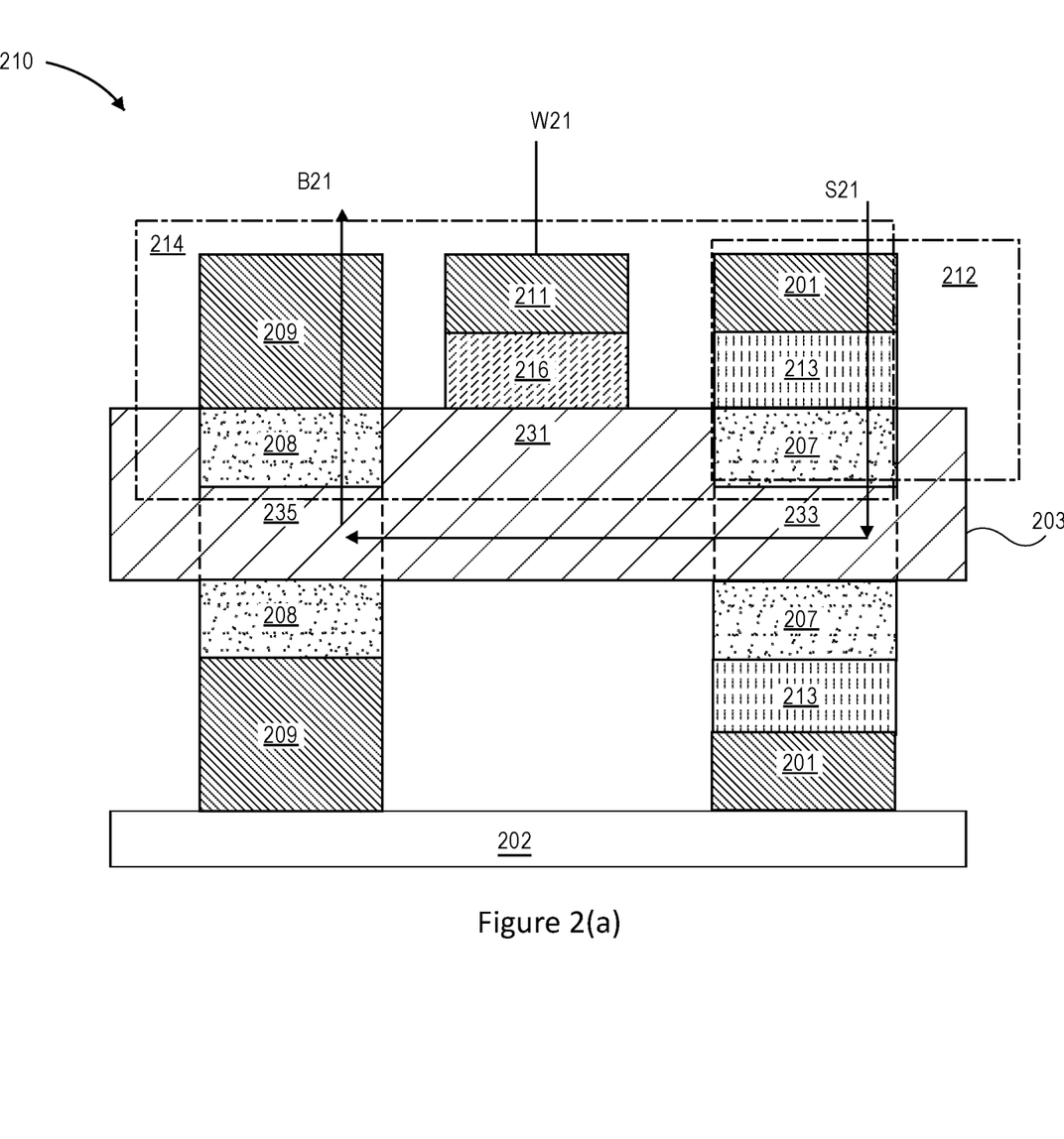
FIGS. 2(a)-2(c) schematically illustrate a three-dimensional view or cross-section views of RRAM memory cells including a FinFET transistor and a RRAM storage cell, in accordance with various embodiments.
Figure 2B:
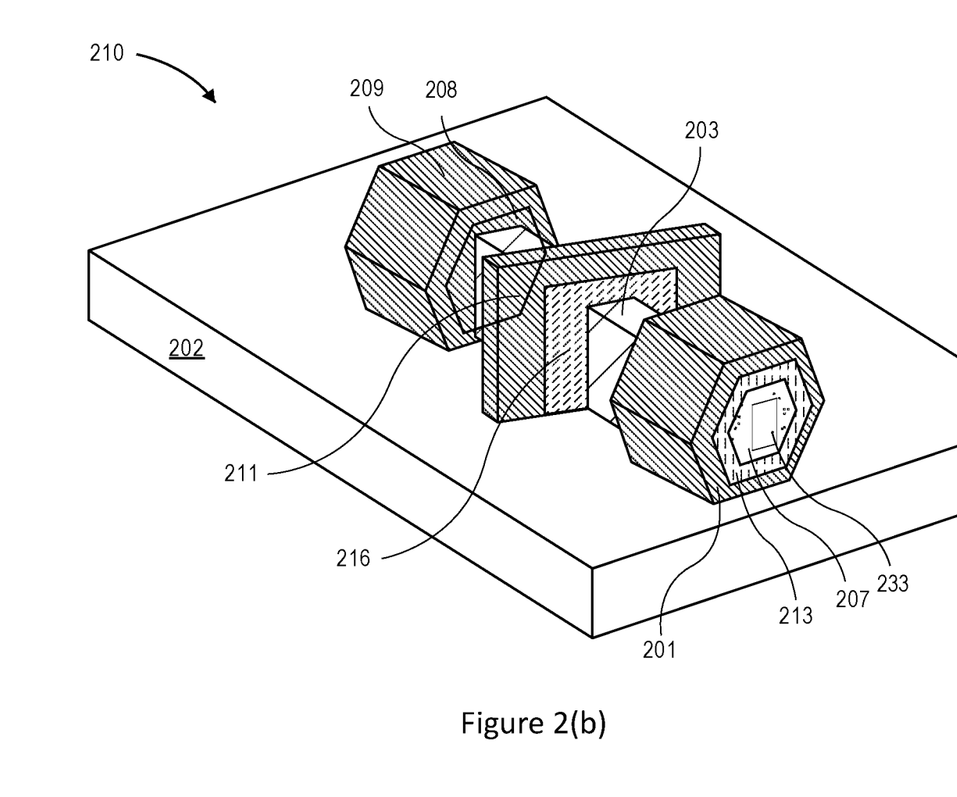
Figure 2C:
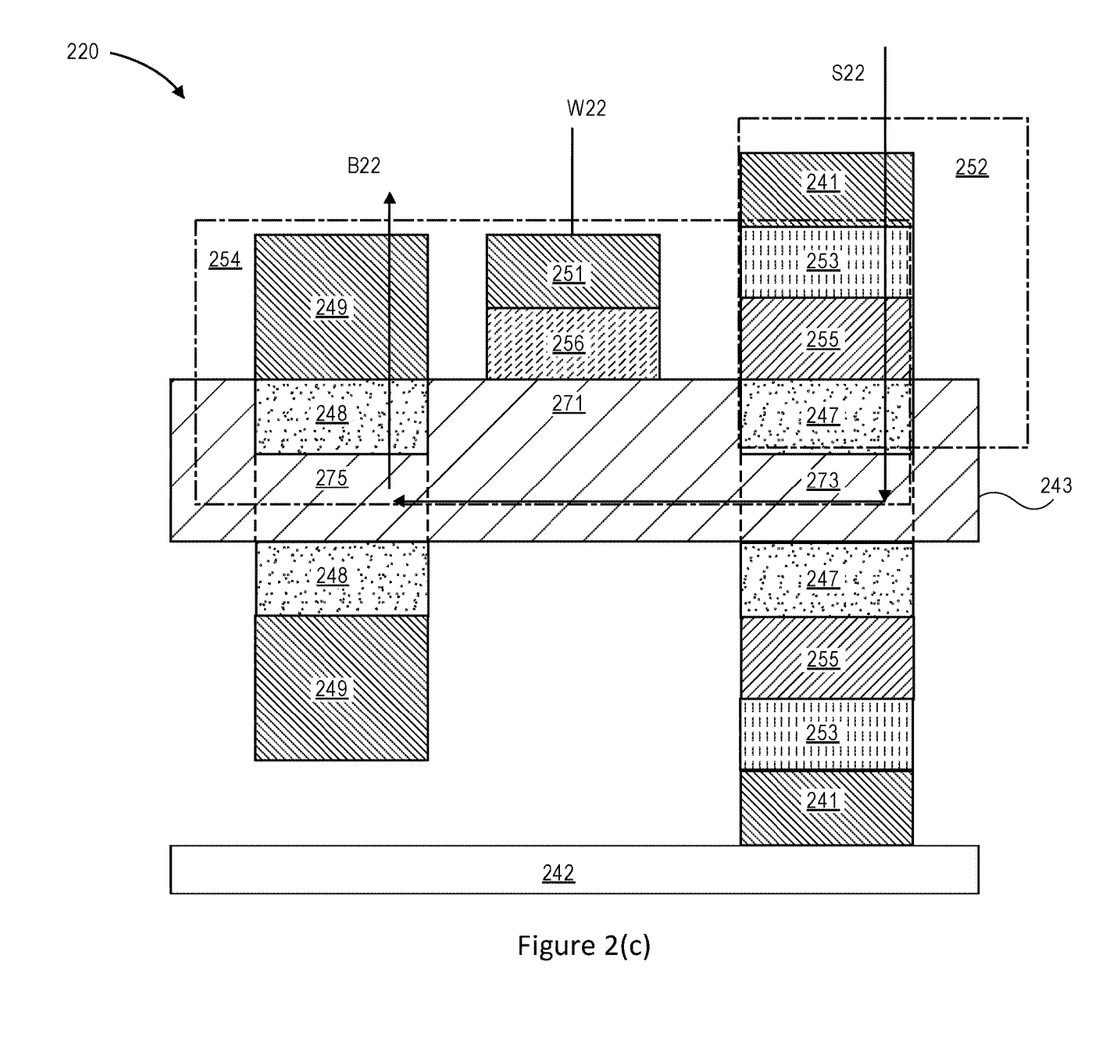

FIGS. 2(a)-2(c) schematically illustrate a three-dimensional view or cross-section views of RRAM memory cells, e.g., a memory cell 210, or a memory cell 220, including a FinFET transistor and a RRAM storage cell, in accordance with various embodiments. The memory cell 210, or the memory cell 220 may be similar to the memory cell 102, the memory cell 104, the memory cell 106, or the memory cell 108, as shown in FIG. 1.

In embodiments, as shown in FIG. 2(a) in cross-section view or in FIG. 2(b) in three-dimensional view, the memory cell 210 includes a FinFET transistor 214 and a RRAM storage cell 212. The FinFET transistor 214 includes a fin structure 203 on a substrate 202, where the fin structure 203 includes a channel region 231, a source region 233 adjacent to the channel region 231, and a drain region 235 adjacent to the channel region 231. An epitaxial layer 207 is around the source region 233, and an epitaxial layer 208 is around the drain region 235. In some embodiments, the epitaxial layer 207 or the epitaxial layer 208 may include a material selected from a group consisting of SiP, Si, $Si_{1-x}Ge_x$, and SiC. A gate electrode 211 is wrapped around the channel region 231, separated from the channel region 231 by a gate dielectric layer 216, and coupled to a word line W21. A contact electrode 209 may be wrapped around the epitaxial layer 208 and coupled to a bit line B21.

In embodiments, the RRAM storage cell 212 includes the epitaxial layer 207, a resistive switching material layer 213, and a contact electrode 201. The resistive switching material layer 213 is in contact and wrapped around a surface of the epitaxial layer 207. The contact electrode 201 is in contact and wrapped around a surface of the resistive switching material layer 213. The contact electrode 201 is coupled to a source line S21. The resistive switching material layer 213 and the contact electrode 201 are above the substrate 202 and may be below a first metal layer of a semiconductor device including the memory cell 210.

In embodiments, the resistive switching material layer 213 may have a thickness in a range of about 1-20 nm. The resistive switching material layer 213 may include a material selected from a group consisting of $HfO_x$, $TaO_x$, $HfTaO_x$, $AlO_x$, $GdO_x$, $TiO_x$, $NiO_x$, $ZrO_x$, ZnO, $SiO_x$, $GeO_x$, Te, Ge, Si, and chalcogenide. Additionally and alternatively, the resistive switching material layer 213 may include a transition metal oxide or a transition metal chalcogenide.

In embodiments, the contact electrode 201, the gate electrode 211, or the contact electrode 209 may be of a shape selected from a group consisting of a rectangular shape, a square shape, an oval shape, a circular shape, a triangular shape, a staircase shape, a trapezoid shape, and a polygon shape. In addition, the contact electrode 201, the gate electrode 211, or the contact electrode 209 may include a material selected from a group consisting of germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), ruthenium (Ru), iridium (Ir), tantalum (Ta), and an alloy of Ti, W, Mo, Au, Pt, Al, Ni, Cu, Cr, Hf, HfAlN, iridium-tantalum alloy (Ir—Ta), indium-tin oxide (ITO), TaN, TiN, TiAlN, TiW, or InAlO.

In embodiments, as shown in FIG. 2(c), the memory cell 220 includes a FinFET transistor 254 and a RRAM storage cell 252. The FinFET transistor 254 includes a fin structure 243 on a substrate 242, where the fin structure 243 includes a channel region 271, a source region 273 adjacent to the channel region 271, and a drain region 275 adjacent to the channel region 271. An epitaxial layer 247 is around the source region 273, and an epitaxial layer 248 is around the drain region 275. A gate electrode 251 is wrapped around the channel region 271, separated from the channel region 271 by a gate dielectric layer 256, and coupled to a word line W22. A contact electrode 249 may be wrapped around an epitaxial layer 248 and coupled to a word line B22.

In embodiments, the RRAM storage cell 252 includes the epitaxial layer 247, a resistive switching material layer 253, and a contact electrode 241. The resistive switching material layer 253 is wrapped around a surface of the epitaxial layer 247. The contact electrode 241 is in contact and wrapped around a surface of the resistive switching material layer 253. The contact electrode 241 is coupled to a source line S22. The resistive switching material layer 253 and the contact electrode 241 are above the substrate 242 and may be below a first metal layer of a semiconductor device including the memory cell 220.

Furthermore, the RRAM storage cell 252 may include an interfacial layer 255 adjacent to the epitaxial layer 247, between the epitaxial layer 247 and the contact electrode 241. The interfacial layer 255 may include a material selected from a group consisting of ZnO, InOx, GaOx, IGZO, IZO, ITO, SnOx, Cu2O, CuO, CoO, amorphous Si, amorphous Ge, polysilicon, a transition metal chalcogenide, and a transition metal oxide.

Figure 3A:
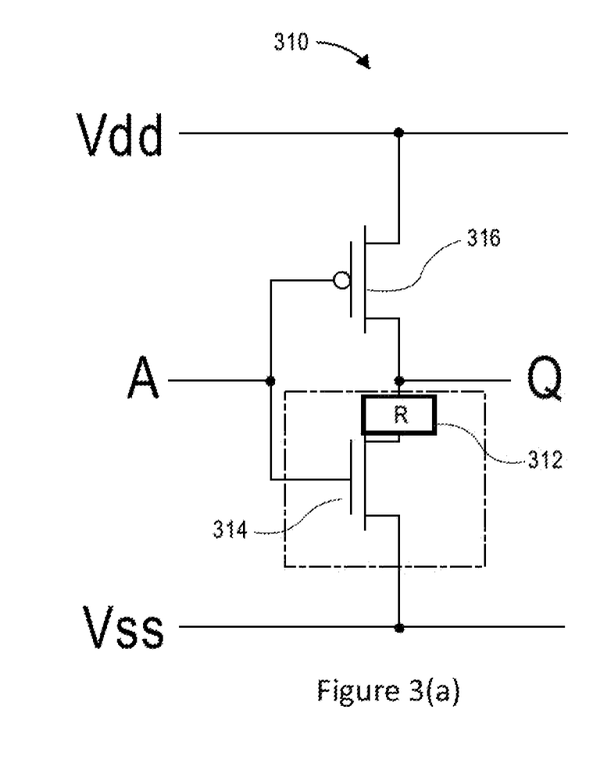
FIGS. 3(a)-3(b) schematically illustrate example integrated circuits (ICs) having RRAM memory cells including a FinFET transistor and a RRAM storage cell, in accordance with various embodiments.
Figure 3B:
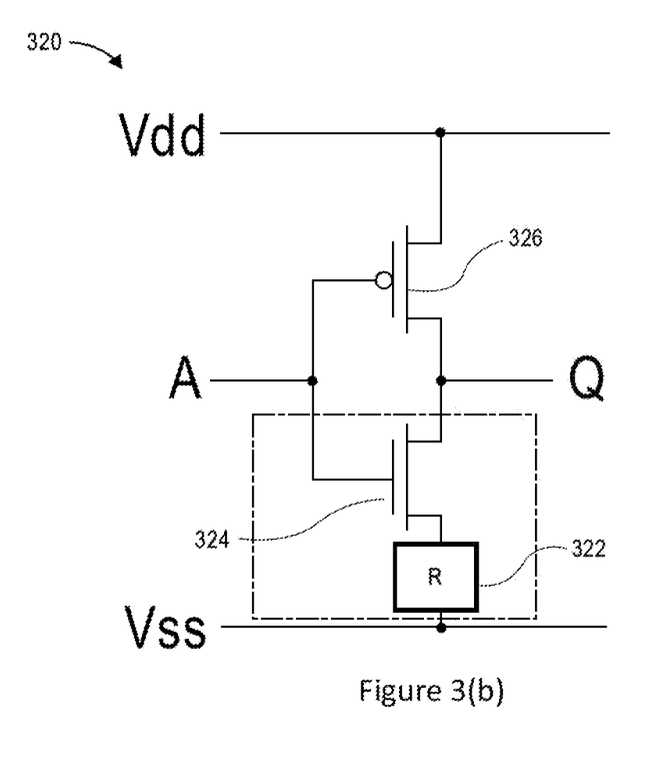

FIGS. 3(a)-3(b) schematically illustrate example ICs, e.g., an IC 310, or an IC 320, having RRAM memory cells including a FinFET transistor and a RRAM storage cell, in accordance with various embodiments. The IC 310 includes a FinFET transistor 314 and a RRAM storage cell 312, in addition to a transistor 316, while the 320 includes a FinFET transistor 324 and a RRAM storage cell 322, in addition to a transistor 326. The FinFET transistor 314 or the FinFET transistor 324, the RRAM storage cell 312 or the RRAM storage cell 322 may be similar to the FinFET transistor 114 and the RRAM storage cell 112 in FIG. 1, the FinFET transistor 214 and the RRAM storage cell 212 in FIGS. 2(a)-2(b), and the FinFET transistor 254 and the RRAM storage cell 252 in FIG. 2(c).

In embodiments, as shown in FIG. 3(a), the RRAM storage cell 312 is integrated with the FinFET transistor 314 to form a RRAM memory cell. For example, the RRAM storage cell 312 is formed as a part of a contact electrode of the FinFET transistor 314. A contact electrode of the RRAM storage cell 312 may be wrapped around a surface of an epitaxial layer, where the epitaxial layer is around a source region or a drain region of a fin structure of the FinFET transistor 314. In addition, the contact electrode of the RRAM storage cell 312 is coupled to an output of an inverter formed by the transistor 316 and the FinFET transistor 314.

In embodiments, as shown in FIG. 3(b), the RRAM storage cell 322 is integrated with the FinFET transistor 324 to form a RRAM memory cell. For example, the RRAM storage cell 322 is formed as a part of a contact electrode of the FinFET transistor 324. A contact electrode of the RRAM storage cell 322 may be wrapped around a surface of an epitaxial layer, where the epitaxial layer is around a source region or a drain region of a fin structure of the FinFET transistor 324. In addition, the contact electrode of the RRAM storage cell 312 is coupled to ground voltage Vss.

Figure 4:
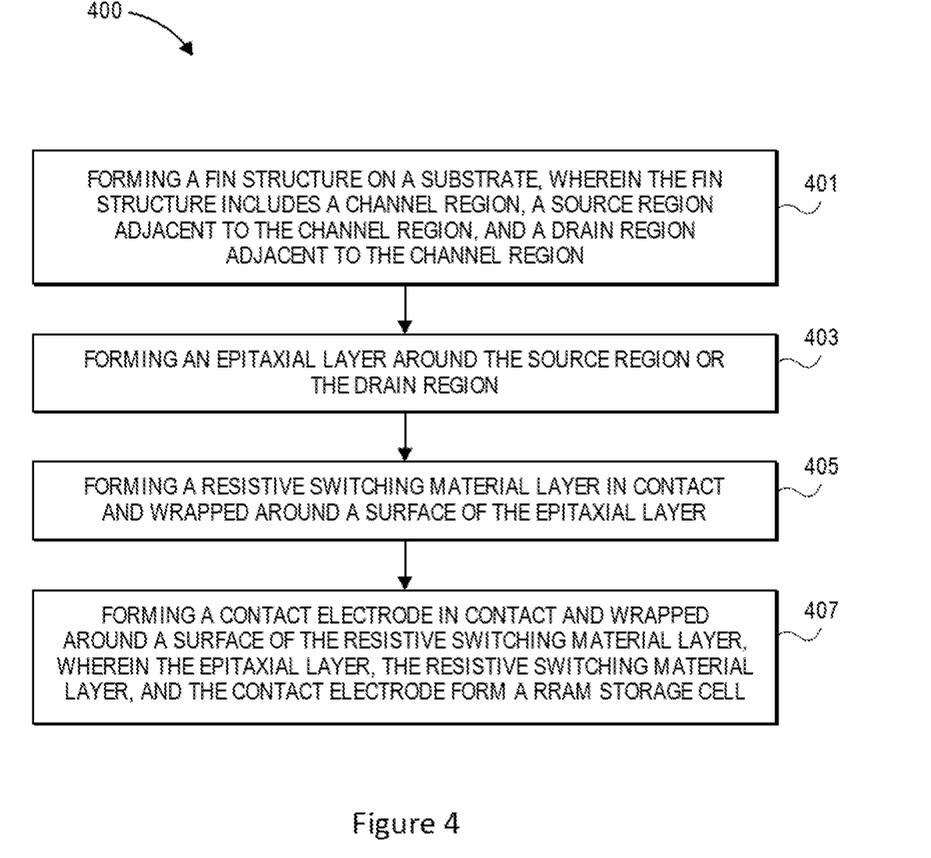
FIG. 4 illustrates a diagram of a process for forming a RRAM memory cell including a FinFET transistor and a RRAM storage cell, in accordance with some embodiments.

FIG. 4 illustrates a diagram of a process 400 for forming a RRAM memory cell including a FinFET transistor and a RRAM storage cell, in accordance with some embodiments. In embodiments, the process 400 may be applied to form a RRAM memory cell including the FinFET transistor 114 and the RRAM storage cell 112 in FIG. 1, the FinFET transistor 214 and the RRAM storage cell 212 in FIGS. 2(a)-2(b), the FinFET transistor 254 and the RRAM storage cell 252 in FIG. 2(c), the FinFET transistor 314 and the RRAM storage cell 312 in FIG. 3(a), or the FinFET transistor 324 and the RRAM storage cell 322 in FIG. 3(b).

At block 401, the process 400 may include forming a fin structure on a substrate, wherein the fin structure includes a channel region, a source region adjacent to the channel region, and a drain region adjacent to the channel region. For example, the process 400 may include forming the fin structure 203 on the substrate 202. The fin structure 203 includes the channel region 231, the source region 233, and the drain region 235 as shown in FIG. 2(a).

At block 403, the process 400 may include forming an epitaxial layer around the source region or the drain region. For example, the process 400 may include forming the epitaxial layer 207 around the source region 233, or forming the epitaxial layer 208 around the drain region 235 as shown in FIG. 2(a).

At block 405, the process 400 may include forming a resistive switching material layer in contact and wrapped around a surface of the epitaxial layer. For example, the process 400 may include forming the resistive switching material layer 213 in contact and wrapped around a surface of the epitaxial layer 207 as shown in FIG. 2(a).

At block 407, the process 400 may include forming a contact electrode in contact and wrapped around a surface of the resistive switching material layer, wherein the epitaxial layer, the resistive switching material layer, and the contact electrode form a RRAM storage cell. For example, the process 400 may include forming the contact electrode 201 in contact and wrapped around a surface of the resistive switching material layer 213. The epitaxial layer 207, the resistive switching material layer 213, and the contact electrode 201 form the RRAM storage cell 212 as shown in FIG. 2(a).

Figure 5:
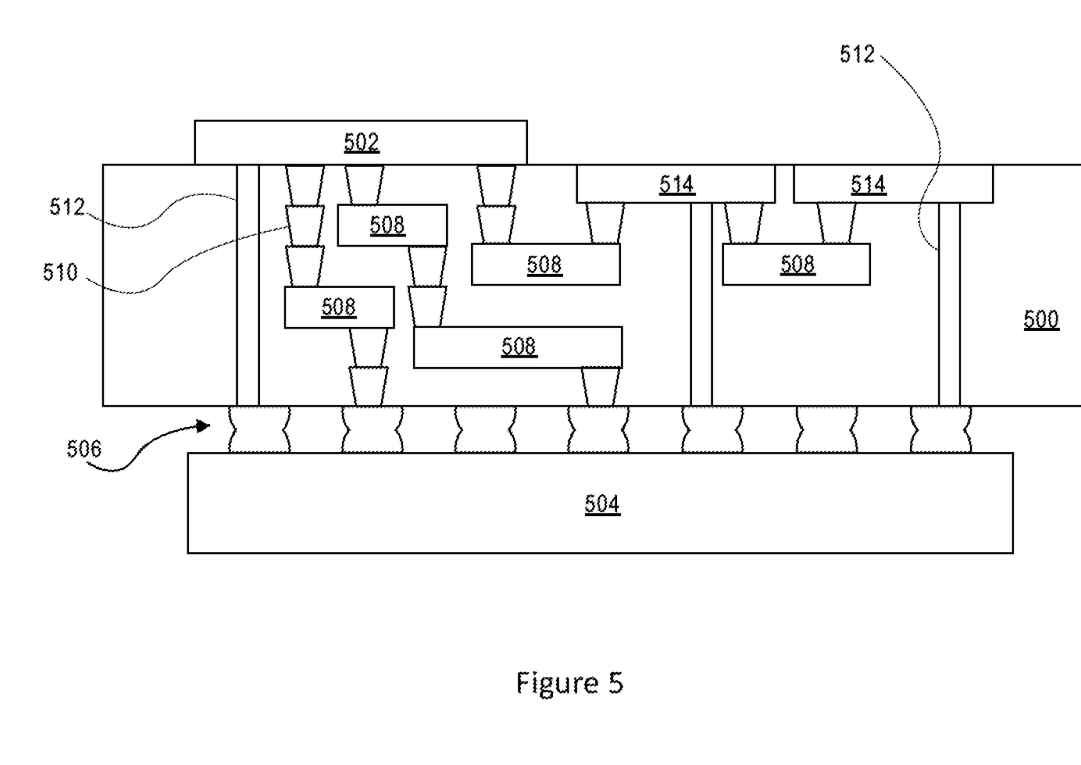
FIG. 5 schematically illustrates an interposer implementing one or more embodiments of the disclosure, in accordance with some embodiments.

FIG. 5 schematically illustrates an interposer 500 implementing one or more embodiments of the disclosure, in accordance with some embodiments. The interposer 500 is an intervening substrate used to bridge a first substrate 502 to a second substrate 504. The first substrate 502 may be, for instance, a substrate support for a RRAM memory cell including a FinFET transistor and a RRAM storage cell, e.g., the FinFET transistor 114 and the RRAM storage cell 112 in FIG. 1, the FinFET transistor 214 and the RRAM storage cell 212 in FIGS. 2(a)-2(b), the FinFET transistor 254 and the RRAM storage cell 252 in FIG. 2(c), the FinFET transistor 314 and the RRAM storage cell 312 in FIG. 3(a), or the FinFET transistor 324 and the RRAM storage cell 322 in FIG. 3(b), or a FinFET transistor and a RRAM storage cell formed according to the process 400 as shown in FIG. 4. The second substrate 504 may be, for instance, a memory module, a computer motherboard, or another integrated circuit die. For example, the second substrate 504 may be a memory module including the RRAM array 100 as shown in FIG. 1. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500.

In accordance with embodiments of the disclosure, apparatuses or processes disclosed herein may be used in the fabrication of interposer 500.

Figure 6:
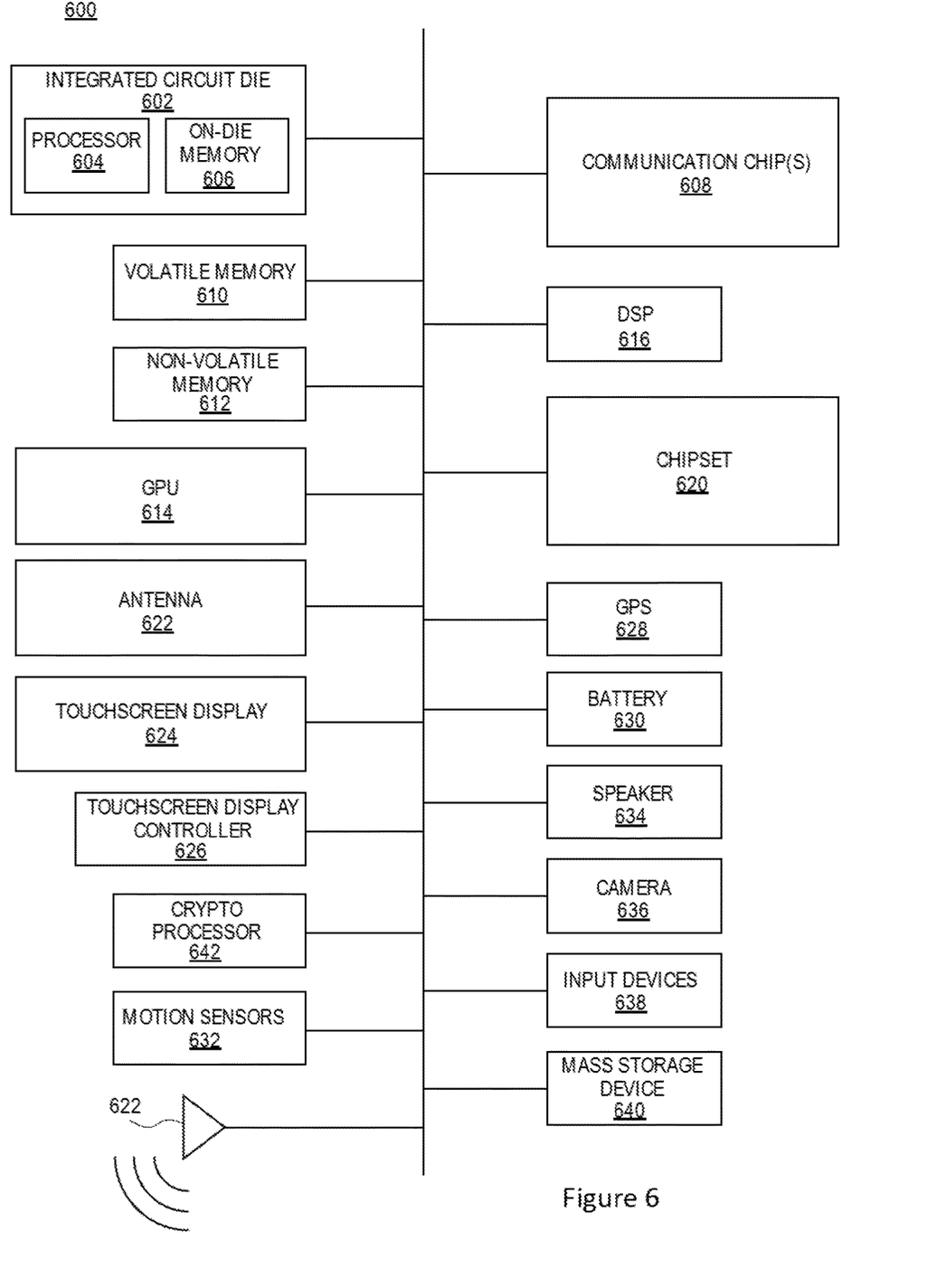
FIG. 6 schematically illustrates a computing device built in accordance with an embodiment of the disclosure, in accordance with some embodiments.

FIG. 6 illustrates a computing device 600 in accordance with one embodiment of the disclosure. The computing device 600 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 600 include, but are not limited to, an integrated circuit die 602 and at least one communications logic unit 608. In some implementations the communications logic unit 608 is fabricated within the integrated circuit die 602 while in other implementations the communications logic unit 608 is fabricated in a separate integrated circuit chip that may be bonded to a substrate or motherboard that is shared with or electronically coupled to the integrated circuit die 602. The integrated circuit die 602 may include a processor 604 as well as on-die memory 606, often used as cache memory, which can be provided by technologies such as embedded DRAM (eDRAM), or SRAM. For example, the on-die memory 606 may include a RRAM memory cell including a FinFET transistor and a RRAM storage cell, e.g., the FinFET transistor 114 and the RRAM storage cell 112 in FIG. 1, the FinFET transistor 214 and the RRAM storage cell 212 in FIGS. 2(a)-2(b), the FinFET transistor 254 and the RRAM storage cell 252 in FIG. 2(c), the FinFET transistor 314 and the RRAM storage cell 312 in FIG. 3(a), or the FinFET transistor 324 and the RRAM storage cell 322 in FIG. 3(b), or a FinFET transistor and a RRAM storage cell formed according to the process 400 as shown in FIG. 4.

In embodiments, the computing device 600 may include a display or a touchscreen display 624, and a touchscreen display controller 626. A display or the touchscreen display 624 may include a FPD, an AMOLED display, a TFT LCD, a micro light-emitting diode (μLED) display, or others. For example, the touchscreen display 624 may include a RRAM memory cell including a FinFET transistor and a RRAM storage cell, e.g., the FinFET transistor 114 and the RRAM storage cell 112 in FIG. 1, the FinFET transistor 214 and the RRAM storage cell 212 in FIGS. 2(a)-2(b), the FinFET transistor 254 and the RRAM storage cell 252 in FIG. 2(c), the FinFET transistor 314 and the RRAM storage cell 312 in FIG. 3(a), or the FinFET transistor 324 and the RRAM storage cell 322 in FIG. 3(b), or a FinFET transistor and a RRAM storage cell formed according to the process 400 as shown in FIG. 4.

Computing device 600 may include other components that may or may not be physically and electrically coupled to the motherboard or fabricated within a SoC die. These other components include, but are not limited to, volatile memory 610 (e.g., dynamic random access memory (DRAM), non-volatile memory 612 (e.g., ROM or flash memory), a graphics processing unit 614 (GPU), a digital signal processor (DSP) 616, a crypto processor 642 (e.g., a specialized processor that executes cryptographic algorithms within hardware), a chipset 620, at least one antenna 622 (in some implementations two or more antenna may be used), a battery 630 or other power source, a power amplifier (not shown), a voltage regulator (not shown), a global positioning system (GPS) device 628, a compass, a motion coprocessor or sensors 632 (that may include an accelerometer, a gyroscope, and a compass), a microphone (not shown), a speaker 634, a camera 636, user input devices 638 (such as a keyboard, mouse, stylus, and touchpad), and a mass storage device 640 (such as hard disk drive, compact disk (CD), digital versatile disk (DVD), and so forth). The computing device 600 may incorporate further transmission, telecommunication, or radio functionality not already described herein. In some implementations, the computing device 600 includes a radio that is used to communicate over a distance by modulating and radiating electromagnetic waves in air or space. In further implementations, the computing device 600 includes a transmitter and a receiver (or a transceiver) that is used to communicate over a distance by modulating and radiating electromagnetic waves in air or space.

The communications logic unit 608 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 600 may include a plurality of communications logic units 608. For instance, a first communications logic unit 608 may be dedicated to shorter range wireless communications such as Wi-Fi, NFC, and Bluetooth and a second communications logic unit 608 may be dedicated to longer range wireless communications such as GPS, EDGE, GPRS, CDMA, WiMAX, LTE, Ev-DO, and others.

The processor 604 of the computing device 600 includes one or more devices, such as transistors. The term "processor" may refer to any device or portion of a device that processes electronic data from registers and/or memory to transform that electronic data into other electronic data that may be stored in registers and/or memory. The communications logic unit 608 may also include one or more devices, such as transistors.

In further embodiments, another component housed within the computing device 600 may contain one or more devices, such as DRAM, that are formed in accordance with implementations of the current disclosure, e.g., a RRAM memory cell including a FinFET transistor and a RRAM storage cell, e.g., the FinFET transistor 114 and the RRAM storage cell 112 in FIG. 1, the FinFET transistor 214 and the RRAM storage cell 212 in FIGS. 2(a)-2(b), the FinFET transistor 254 and the RRAM storage cell 252 in FIG. 2(c), the FinFET transistor 314 and the RRAM storage cell 312 in FIG. 3(a), or the FinFET transistor 324 and the RRAM storage cell 322 in FIG. 3(b), or a FinFET transistor and a RRAM storage cell formed according to the process 400 as shown in FIG. 4.

In various embodiments, the computing device 600 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some non-limiting Examples are provided below.

Example 1 may include a semiconductor device, comprising: a FinFET transistor including a fin structure on a substrate, wherein the fin structure includes a channel region, a source region adjacent to the channel region, and a drain region adjacent to the channel region, an epitaxial layer around the source region or the drain region; and a resistive random access memory (RRAM) storage stack wrapped around a surface of the epitaxial layer, the RRAM storage stack including: a resistive switching material layer in contact and wrapped around the surface of the epitaxial layer; and a contact electrode in contact and wrapped around a surface of the resistive switching material layer, wherein the epitaxial layer, the resistive switching material layer, and the contact electrode form a RRAM storage cell.

Example 2 may include the semiconductor device of example 1 and/or some other examples herein, wherein the epitaxial layer is around the source region, and the contact electrode is a source electrode, or the epitaxial layer is around the drain region, and the contact electrode is a drain electrode.

Example 3 may include the semiconductor device of example 1 and/or some other examples herein, the resistive switching material layer includes a material selected from a group consisting of HfOx, TaOx, HfTaOx, $AlO_x$, $GdO_x$, $TiO_x$, $NiO_x$, $ZrO_x$, ZnO, $SiO_x$, $GeO_x$, Te, Ge, Si, and chalcogenide.

Example 4 may include the semiconductor device of example 1 and/or some other examples herein, wherein the resistive switching material layer includes a transition metal oxide or a transition metal chalcogenide.

Example 5 may include the semiconductor device of example 1 and/or some other examples herein, wherein the epitaxial layer includes a material selected from a group consisting of SiP, Si, $Si_{1-x}Ge_x$, and SiC.

Example 6 may include the semiconductor device of example 1 and/or some other examples herein, wherein the RRAM storage stack further includes an interfacial layer adjacent to the epitaxial layer, between the epitaxial layer and the contact electrode.

Example 7 may include the semiconductor device of example 6 and/or some other examples herein, wherein the interfacial layer includes a material selected from a group consisting of ZnO, InOx, GaOx, IGZO, IZO, ITO, SnOx, Cu2O, CuO, CoO, amorphous Si, amorphous Ge, polysilicon, a transition metal chalcogenide, and a transition metal oxide.

Example 8 may include the semiconductor device of example 1 and/or some other examples herein, wherein the resistive switching material layer has a thickness in a range of about 1-20 nm.

Example 9 may include the semiconductor device of example 1 and/or some other examples herein, wherein the resistive switching material layer and the contact electrode are above the substrate and below a first metal layer of the semiconductor device.

Example 10 may include the semiconductor device of example 1 and/or some other examples herein, wherein the contact electrode is coupled to a ground voltage, or to an output of an inverter.

Example 11 may include the semiconductor device of example 1 and/or some other examples herein, wherein the substrate is a bulk substrate or a silicon-on-insulator (SOI) substrate.

Example 12 may include the semiconductor device of example 1 and/or some other examples herein, wherein the FinFET transistor is a PMOS FinFET or a NMOS FinFET.

Example 13 may include the semiconductor device of example 1 and/or some other examples herein, the FinFET transistor is a FinFET, a tri-gate FinFET transistor, a multiple-gate field-effect transistor (MuGFET), or a gate-all-around FET.

Example 14 may include the semiconductor device of example 1 and/or some other examples herein, wherein the contact electrode includes a material selected from a group consisting of germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), ruthenium (Ru), iridium (Ir), tantalum (Ta), and an alloy of Ti, W, Mo, Au, Pt, Al, Ni, Cu, Cr, Hf, HfAlN, iridium-tantalum alloy (Ir—Ta), indium-tin oxide (ITO), TaN, TiN, TiAlN, TiW, or InAlO.

Example 15 may include a method for forming a semiconductor device, the method comprising: forming a fin structure on a substrate, wherein the fin structure includes a channel region, a source region adjacent to the channel region, and a drain region adjacent to the channel region; forming an epitaxial layer around the source region or the drain region; forming a resistive switching material layer in contact and wrapped around a surface of the epitaxial layer; and forming a contact electrode in contact and wrapped around a surface of the resistive switching material layer, wherein the epitaxial layer, the resistive switching material layer, and the contact electrode form a RRAM storage cell.

Example 16 may include the method of example 15 and/or some other examples herein, further comprising: forming an interfacial layer adjacent to the epitaxial layer, between the epitaxial layer and the contact electrode, wherein the interfacial layer includes a material selected from a group consisting of ZnO, InOx, GaOx, IGZO, IZO, ITO, SnOx, Cu2O, CuO, CoO, amorphous Si, amorphous Ge, polysilicon, a transition metal chalcogenide, and a transition metal oxide.

Example 17 may include the method of example 15 and/or some other examples herein, wherein the resistive switching material layer includes a material selected from a group consisting of HfOx, TaOx, HfTaOx, $AlO_x$, $GdO_x$, $TiO_x$, $NiO_x$, $ZrO_x$, ZnO, $SiO_x$, $GeO_x$, Te, Ge, Si, and chalcogenide.

Example 18 may include the method of example 15 and/or some other examples herein, wherein the epitaxial layer includes a material selected from a group consisting of SiP, Si, $Si_{1-x}Ge_x$, and SiC.

Example 19 may include the method of example 15 and/or some other examples herein, wherein the resistive switching material layer and the contact electrode are below the first metal layer.

Example 20 may include the method of example 15 and/or some other examples herein, wherein the resistive switching material layer has a thickness in a range of about 1-20 nm.

Example 21 may include a computing device, comprising: a circuit board; and a memory device coupled to the circuit board and including a plurality of resistive random access memory (RRAM) memory cells, wherein a RRAM memory cell of the plurality of RRAM memory cells includes a FinFET transistor and a RRAM storage cell; wherein the FinFET transistor includes: a fin structure on a substrate, wherein the fin structure includes a channel region, a source region adjacent to the channel region, and a drain region adjacent to the channel region; an epitaxial layer around the source region or the drain region; a gate electrode wrapped around the channel region and coupled to a word line of the memory device; and the RRAM storage cell includes the epitaxial layer, a resistive switching material layer, and a contact electrode, wherein: the resistive switching material layer is in contact and wrapped around the surface of the epitaxial layer; and the contact electrode is in contact and wrapped around a surface of the resistive switching material layer, wherein the contact electrode is coupled to a source line of the memory device.

Example 22 may include computing device of example 21 and/or some other examples herein, wherein the resistive switching material layer includes a material selected from a group consisting of HfOx, TaOx, HfTaOx, $AlO_x$, $GdO_x$, $TiO_x$, $NiO_x$, $ZrO_x$, ZnO, $SiO_x$, $GeO_x$, Te, Ge, Si, and chalcogenide.

Example 23 may include computing device of example 21 and/or some other examples herein, wherein the epitaxial layer includes a material selected from a group consisting of SiP, Si, $Si_{1-x}Ge_x$, and SiC.

Example 24 may include computing device of example 21 and/or some other examples herein, wherein the resistive switching material layer and the contact electrode are below the first metal layer.

Example 25 may include computing device of example 21 and/or some other examples herein, wherein the computing device is a wearable device or a mobile computing device, the wearable device or the mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a FinFET transistor including a fin structure on a substrate, wherein the fin structure includes a channel region, a source region adjacent to the channel region, and a drain region adjacent to the channel region, an epitaxial layer around the source region or the drain region; and
   a resistive random access memory (RRAM) storage stack wrapped around a surface of the epitaxial layer, the RRAM storage stack including:
      a resistive switching material layer in contact and wrapped around the surface of the epitaxial layer; and
      a contact electrode in contact and wrapped around a surface of the resistive switching material layer, wherein the epitaxial layer, the resistive switching material layer, and the contact electrode form a RRAM storage cell.

2. The semiconductor device of claim 1, wherein the epitaxial layer is around the source region, and the contact electrode is a source electrode, or the epitaxial layer is around the drain region, and the contact electrode is a drain electrode.

3. The semiconductor device of claim 1, the resistive switching material layer includes a material selected from a group consisting of HfOx, TaOx, HfTaOx, $AlO_x$, $GdO_x$, $TiO_x$, $NiO_x$, $ZrO_x$, ZnO, $SiO_x$, $GeO_x$, Te, Ge, Si, and chalcogenide.

4. The semiconductor device of claim 1, wherein the resistive switching material layer includes a transition metal oxide or a transition metal chalcogenide.

5. The semiconductor device of claim 1, wherein the epitaxial layer includes a material selected from a group consisting of SiP, Si, $Si_{1-x}Ge_x$, and SiC.

6. The semiconductor device of claim 1, wherein the RRAM storage stack further includes an interfacial layer adjacent to the epitaxial layer, between the epitaxial layer and the contact electrode.

7. The semiconductor device of claim 6, wherein the interfacial layer includes a material selected from a group consisting of ZnO, InOx, GaOx, IGZO, IZO, ITO, SnOx, Cu2O, CuO, CoO, amorphous Si, amorphous Ge, polysilicon, a transition metal chalcogenide, and a transition metal oxide.

8. The semiconductor device of claim 1, wherein the resistive switching material layer has a thickness in a range of about 1-20 nm.

9. The semiconductor device of claim 1, wherein the resistive switching material layer and the contact electrode are above the substrate and below a first metal layer of the semiconductor device.

10. The semiconductor device of claim 1, wherein the contact electrode is coupled to a ground voltage, or to an output of an inverter.

11. The semiconductor device of claim 1, wherein the substrate is a bulk substrate or a silicon-on-insulator (SOI) substrate.

12. The semiconductor device of claim 1, wherein the FinFET transistor is a PMOS FinFET or a NMOS FinFET.

13. The semiconductor device of claim 1, the FinFET transistor is a FinFET, a tri-gate FinFET transistor, a multiple-gate field-effect transistor (MuGFET), or a gate-all-around FET.

14. The integrated circuit of claim 1, wherein the contact electrode includes a material selected from a group consisting of germanium (Ge), cobalt (Co), titanium (Ti), tungsten (W), molybdenum (Mo), gold (Au), platinum (Pt), aluminum (Al), nickel (Ni), copper (Cu), chromium (Cr), hafnium (Hf), indium (In), ruthenium (Ru), iridium (Ir), tantalum (Ta), and an alloy of Ti, W, Mo, Au, Pt, Al, Ni, Cu, Cr, Hf, HfAlN, iridium-tantalum alloy (Ir—Ta), indium-tin oxide (ITO), TaN, TiN, TiAlN, TiW, or InAlO.

15. A method for forming a semiconductor device, the method comprising:
   forming a fin structure on a substrate, wherein the fin structure includes a channel region, a source region adjacent to the channel region, and a drain region adjacent to the channel region;
   forming an epitaxial layer around the source region or the drain region;
   forming a resistive switching material layer in contact and wrapped around a surface of the epitaxial layer; and
   forming a contact electrode in contact and wrapped around a surface of the resistive switching material layer, wherein the epitaxial layer, the resistive switching material layer, and the contact electrode form a RRAM storage cell.

16. The method of claim 15, further comprising:
forming an interfacial layer adjacent to the epitaxial layer, between the epitaxial layer and the contact electrode, wherein the interfacial layer includes a material selected from a group consisting of ZnO, InOx, GaOx, IGZO, IZO, ITO, SnOx, Cu2O, CuO, CoO, amorphous Si, amorphous Ge, polysilicon, a transition metal chalcogenide, and a transition metal oxide.

17. The method of claim 15, wherein the resistive switching material layer includes a material selected from a group consisting of HfOx, TaOx, HfTaOx, $AlO_x$, $GdO_x$, $TiO_x$, $NiO_x$, $ZrO_x$, ZnO, $SiO_x$, $GeO_x$, Te, Ge, Si, and chalcogenide.

18. The method of claim 15, wherein the epitaxial layer includes a material selected from a group consisting of SiP, Si, $Si_{1-x}Ge_x$, and SiC.

19. The method of claim 15, wherein the resistive switching material layer and the contact electrode are below the first metal layer.

20. The method of claim 15, wherein the resistive switching material layer has a thickness in a range of about 1-20 nm.

21. A computing device, comprising:
a circuit board; and
a memory device coupled to the circuit board and including a plurality of resistive random access memory (RRAM) memory cells, wherein a RRAM memory cell of the plurality of RRAM memory cells includes a FinFET transistor and a RRAM storage cell;
wherein the FinFET transistor includes:
a fin structure on a substrate, wherein the fin structure includes a channel region, a source region adjacent to the channel region, and a drain region adjacent to the channel region;
an epitaxial layer around the source region or the drain region;
a gate electrode wrapped around the channel region and coupled to a word line of the memory device; and
the RRAM storage cell includes the epitaxial layer, a resistive switching material layer, and a contact electrode, wherein:
the resistive switching material layer is in contact and wrapped around the surface of the epitaxial layer; and
the contact electrode is in contact and wrapped around a surface of the resistive switching material layer, wherein the contact electrode is coupled to a source line of the memory device.

22. The computing device of claim 21, wherein the resistive switching material layer includes a material selected from a group consisting of HfOx, TaOx, HfTaOx, $AlO_x$, $GdO_x$, $TiO_x$, $NiO_x$, $ZrO_x$, ZnO, $SiO_x$, $GeO_x$, Te, Ge, Si, and chalcogenide.

23. The computing device of claim 21, wherein the epitaxial layer includes a material selected from a group consisting of SiP, Si, $Si_{1-x}Ge_x$, and SiC.

24. The computing device of claim 21, wherein the resistive switching material layer and the contact electrode are below the first metal layer.

25. The computing device of claim 21, wherein the computing device is a wearable device or a mobile computing device, the wearable device or the mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

* * * * *